United States Patent [19]

Nagai

[11] 4,398,162
[45] Aug. 9, 1983

[54] LADDER-TYPE PIEZOELECTRIC FILTERS

[75] Inventor: Takesumi Nagai, Nagoya, Japan

[73] Assignee: NGK Spark Plug Co., Ltd., Nagoya, Japan

[21] Appl. No.: 311,292

[22] Filed: Oct. 13, 1981

[30] Foreign Application Priority Data

Oct. 22, 1980 [JP] Japan .......................... 55/150778[U]

[51] Int. Cl.³ ...................... H03H 9/09; H03H 9/13; H03H 9/54; H03H 9/52
[52] U.S. Cl. .................................. 333/189; 333/190; 310/348
[58] Field of Search ............................... 333/187–192; 310/331, 340–345, 348–356; 29/25, 35

[56] References Cited

U.S. PATENT DOCUMENTS

| | | | |
|---|---|---|---|
| 2,927,285 | 3/1960 | Curran et al. | 310/342 X |
| 4,323,865 | 4/1982 | Tanaka et al. | 333/189 X |
| 4,353,045 | 10/1982 | Matsui et al. | 333/190 |

*Primary Examiner*—Marvin L. Nussbaum
*Attorney, Agent, or Firm*—Mason, Fenwick & Lawrence

[57] ABSTRACT

A ladder-type piezoelectric filter comprising a series-parallel combination of piezoelectric ceramic resonators and a plurality of connector elements each disposed on each side of each resonator, wherein an insulating elastic member is inserted between each resonator and each connector element to provide an excellent impact resistance and group delay frequency characteristics.

5 Claims, 5 Drawing Figures

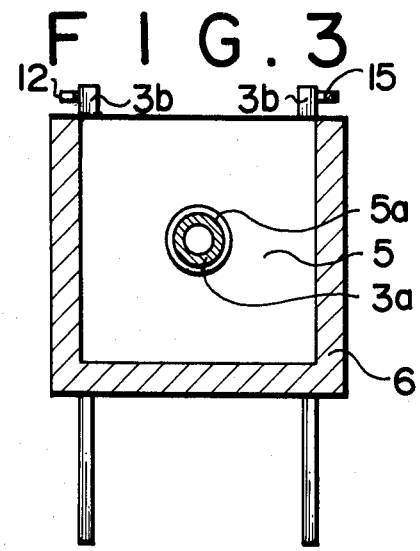
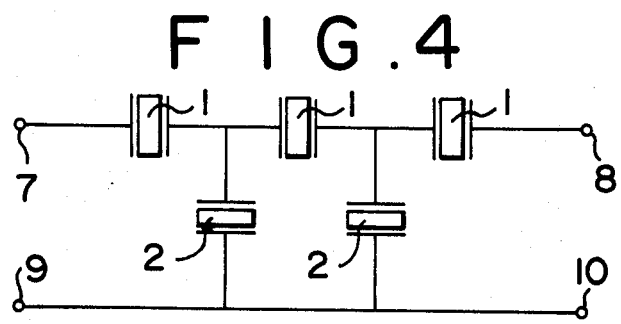
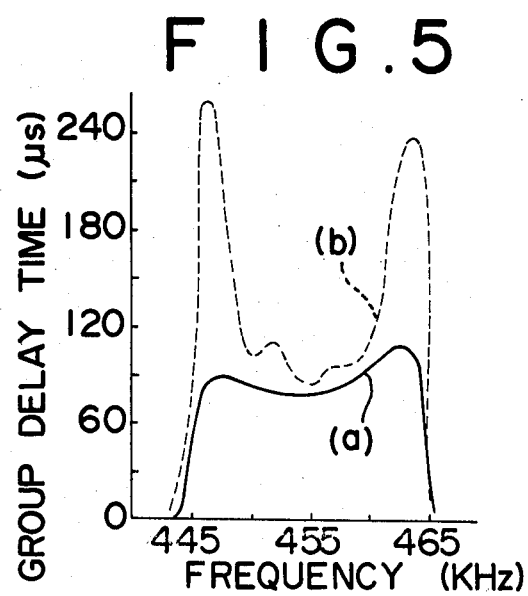

LADDER-TYPE PIEZOELECTRIC FILTERS

The present invention relates to a ladder-type piezoelectric filter comprising a plurality of piezoelectric ceramic filters.

It is known that ladder-type filters comprise a ladder-type arrangement of ceramic resonators which function mainly based on their circumferential or axial oscillation, and are widely used as IF filters for walkie-talkies, carborne wireless sets, pocket bell sets and the like.

For holding ceramic resonators, lead wires may be soldered to oscillation nodes at the centers of the resonator square plates or disks, or they may be held under spring compression. However, for electrically connecting many resonators housed in a small casing, a solderless bonding under compression is desirable.

There has been proposed a ladder-type filter in which a plurality of series resonators and a plurality of parallel resonators are arranged alternately to each other, and connector plates are disposed on each side of the respective resonator, each connector plate having a small protrusion abutting against an oscillation node of each said resonator. For electrical connection, lead wires are soldered to the connector plate terminals with insulating spacers inserted as required to form an intended filter circuit. To apply suitable compression to the resonators, the casing may be screw-tightened at its one end.

In such well-known ladder-type piezoelectric filters, the resonators are held only partially or locally by the contact pressure applied thereto by the small protrusions of the connector plates, even the slightest external impact may easily tilt the resonators or dislocate their supporting points to deteriorate the filter performance remarkably. Further, the conventional ladder-type piezoelectric filters have suffered from much inferior group delay frequency characteristics.

It is therefore an object of the present invention to provide a ladder-type piezoelectric filter which overcomes the aforementioned disadvantages of the conventional ladder-type piezoelectric filters and which has an improved impact resistance as well as improved group delay frequency characteristics.

According to the present invention there is provided a ladder-type piezoelectric filter comprising at least one series resonator, at least one parallel resonator, a plurality of connector elements each disposed on each side of each said resonator and having a small protrusion abutting against an oscillation node of each resonator, at least one insulator inserted between adjacent connector elements which are preselected out of said connector plates so as to provide a desired ladder-type filter circuit, an insulating elastic members each inserted between each said resonator and each said connector element in tight contact thereto and having an opening for passing the connector element protrusion, and an insulating housing for accommodating the foregoing components in a cascade arrangement.

In preferred form of the present invention a plurality of series resonators are arranged alternately with a plurality of parallel resonators. These resonators are provided with electrodes of silver, copper or the like attached onto the opposite sides thereof. The parallel resonator is made thinner than the series resonator or has the effective surface area of its electrodes made larger than that of the latter to provide it with a larger capacitance.

For better understanding of the present invention, reference is made to the following detailed disclosure of the preferred embodiment of the invention taken in conjunction with the accompanying drawings thereof, wherein:

FIG. 3 is a cross section taken on the line B—B of FIG. 2;

FIG. 4 is a schematic circuit diagram of the ladder-type piezoelectric filter shown in FIGS. 1, 2 and 3; and FIG. 5 is a chart showing the group delay frequency characteristics of the ladder-type piezoelectric filter of the present invention as compared with the characteristics of a typical example of well-known ladder-type filter.

Figure 1:
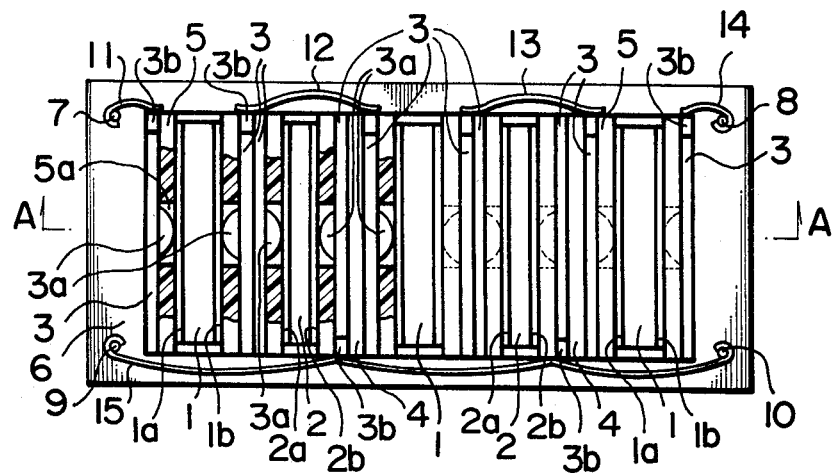
FIG. 1 is a plan view showing partially in section one preferred embodiment of the ladder-type piezoelectric filter according to the present invention.
Figure 2:
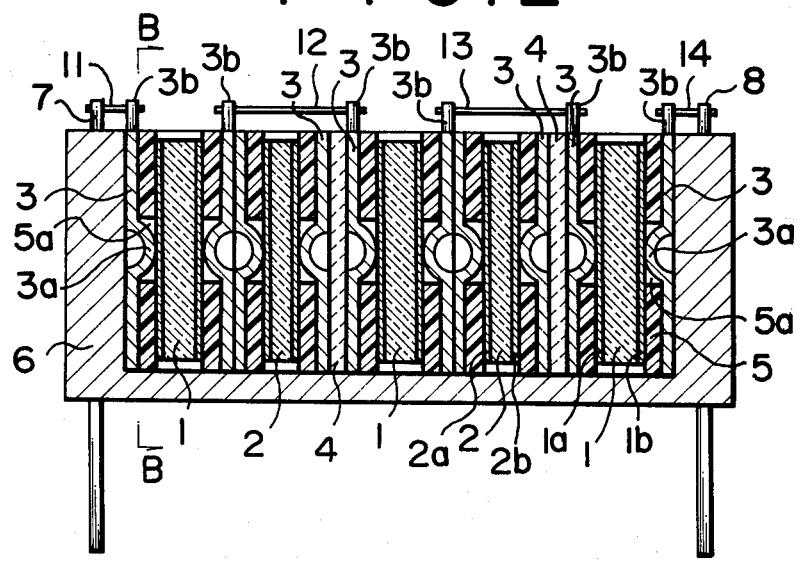
FIG. 2 is a longitudinal section taken on the line A—A of FIG. 1.

With reference the FIGS. 1 to 3 which show one embodiment of the invention, similar reference parts are designated by the same reference numerals. Reference numerals 1 and 2 represent series resonators and parallel resonators, respectively, which are disposed alternately with each other. These resonators each comprise a square plate or disc of lead titanate zirconate or the like material. Electrodes $1a$, $1b$ and $2a$, $2b$ of silver, copper or the like are attached onto the opposite sides of each series resonator 1 and parallel resonator 2, respectively. After application of the electrodes $1a$, $1b$ and $2a$, $2b$, the resonators 1 and 2 are processed to be polarized in their axial or thickness direction. The respective parallel resonator 2 is made thinner than the respective series resonator 1 or has the effective surface area of its electrode $2a$, $2b$ made larger than that of the latter to provide it with a larger capacitance.

The numeral 3 represents connector plates each of which is disposed on each side of each series resonator 1 and parallel resonator 2. As seen in FIG. 2, each concentor plate 3 has a small protrusion $3a$ abutting against an oscillation node of each resonator and a terminal $3b$ provided on the top thereof, while 4 represents insulator plates of synthetic resin or the like material which are inserted between the preselected adjacent connector plates 3, 3 so as to form a desired ladder-type filter circuit as shown in FIG. 4, for example. The numeral 5 represents insulating elastic plates of silicone rubber or the like material each of which is inserted between each resonator (1, 2) and each connector plate 3 in tight contact thereto and has an opening $5a$ for passing the protrusion $3a$ of the connector plate 3.

The assembly of the series resonators 1, parallel resonators 2, connector plates 3, insulator plates 4 and insulating elastic plates 5 is accommodated in a rectangular insulating housing 6 of a suitable material.

As shown in FIG. 1, the housing 6 is provided with an input terminal pin 7, output terminal pin 8 and two earth terminal pins 9 and 10 at its four corners, respectively. These terminal pins 7 to 10 may be preferably embeded in or soldered to the corners of the top portion of the housing 5. Numerals 11 through 15 are lead wires or conductors for internal connection between the respective terminal pin and any one of the terminals $3b$ of the connector plates 3, and between the terminals $3b$, $3b$, respectively, so that the ladder-type filter circuit as shown in FIG. 4 is formed.

Thus, according to the present invention, the elastic insulating plate 5 inserted between the opposed faces of adjacent resonators 1, 2 and connector plates 3 function as spacers, and therefore the resonators 1 and 2 neither get tilted nor have their supporting points dislocated even when subjected to an external impact.

Further, according to the present invention, since the elastic insulator plates 5 are in tight contact with opposite sides of the resonators 1 and 2, the resonators can have an increased resonance resistance and, thus, a substantially decreased mechanical quality factor (Q-factor). Consequently, the ladder-type piezoelectric filters according to the present invention have remarkably improved group delay frequency characteristics as shown by a solid line curve (a) in FIG. 5 in which a broken line curve (b) shows the characteristics of the conventional ladder-type filters.

As fully described hereinbefore, the present invention provides improved ladder-type piezoelectric filters having an excellent impact resistance and group delay frequency characteristics.

It should be understood that the illustrated embodiment is intended to provide 5-element ladder-type filter, but the present invention may be equally applied to the other filters than 5-element ladder-type filter.

The foregoing description is intended to set forth examples of the present invention and many changes and modifications are possible without departing from the spirit and scope of the present invention. It is therefore contemplated to cover by the present application any and all such modifications that fall within the spirit and scope of the basic underlying principles disclosed and claimed herein.

What is claimed is:

1. A ladder-type piezoelectric filter comprising at least one series resonator, at least one parallel resonator, a plurality of connector elements each disposed on each side of each said resonator and having a small protrusion abutting against an oscillation node of each resonator, elastic insulator members each inserted between each said resonator and each said connector element in tight contact thereto and having an opening for passing the connector element protrusion, and an insulating housing for accommodating the foregoing components in a cascade arrangement.

2. A ladder-type piezoelectric filter comprising a plurality of series resonators and a plurality of parallel resonators arranged alternately with each other, a plurality of connector elements each disposed on each side of each said resonator and having a small protrusion abutting against an oscillation node of each said resonator, elastic insulator members each inserted between each said resonator and each said connector element in tight contact thereto, at least one insulator each inserted between adjacent connector elements which are preselected out of said plurality of connector elements so as to provide a desired ladder-type filter circuit, an insulating housing for accommodating the foregoing components in a cascade arrangement.

3. A ladder-type piezoelectric filter according to claim 1 or 2, wherein each resonator has electrodes of silver, copper or the like attached onto the opposite side thereof.

4. A ladder-type piezoelectric filter according to claim 1 or 2, wherein each parallel resonator is made thinner than each series resonator.

5. A ladder-type piezoelectric filter according to claim 3, wherein each parallel resonator has the effective surface area of its electrodes made larger than that of each series resonator.

* * * * *